(12) United States Patent
Chakrabarti et al.

(10) Patent No.: US 8,138,704 B2
(45) Date of Patent: Mar. 20, 2012

(54) METHODS AND SYSTEMS FOR DETECTING CURRENT SENSOR ERROR

(75) Inventors: Sibaprasad Chakrabarti, West Midnapur (IN); Wei D. Wang, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 495 days.

(21) Appl. No.: 12/470,777

(22) Filed: May 22, 2009

(65) Prior Publication Data

US 2010/0295492 A1     Nov. 25, 2010

(51) Int. Cl.
*H02P 6/12*     (2006.01)
*H02P 7/00*     (2006.01)

(52) U.S. Cl. .............. 318/432; 318/400.15; 318/434; 318/747

(58) Field of Classification Search .......... 318/400.15, 318/400.23, 432, 434, 747
See application file for complete search history.

(56) References Cited

U.S. PATENT DOCUMENTS

| | | | | |
|---|---|---|---|---|
| 6,417,643 | B1 * | 7/2002 | Shiba et al. | 318/700 |
| 7,315,147 | B2 * | 1/2008 | Takeuchi | 318/723 |
| 7,839,108 | B2 * | 11/2010 | Patel et al. | 318/432 |
| 2003/0071591 | A1 * | 4/2003 | Ta et al. | 318/434 |
| 2008/0297102 | A1 * | 12/2008 | Kim et al. | 318/803 |

OTHER PUBLICATIONS

Schulz, S.E. et al. "Harmonic Torque Ripple Reduction At Low Motor Speeds," U.S. Appl. No. 12/108,868, filed Apr. 24, 2008.

* cited by examiner

*Primary Examiner* — Thomas Dougherty
(74) *Attorney, Agent, or Firm* — Ingrassia Fisher & Lorenz, P.C.

(57) ABSTRACT

Methods and systems are provided for controlling an electric motor in a vehicle. A method comprises measuring current associated with a first phase of the electric motor using a first current sensor resulting in a measured first phase current and measuring current associated with a second phase of the electric motor using a second current sensor resulting in a measured second phase current. The method further comprises determining a target value for the measured second phase current based on a value corresponding to a peak current for the first phase and identifying a current sensor error based on a difference between the measured second phase current and the target value.

20 Claims, 3 Drawing Sheets

METHODS AND SYSTEMS FOR DETECTING CURRENT SENSOR ERROR

TECHNICAL FIELD

Embodiments of the subject matter described herein relate generally to electric motor drive systems, and more particularly, embodiments of the subject matter relate to methods and apparatus for detecting a current sensor error in electric motor drive systems having two current sensors.

BACKGROUND

In vehicles using electric traction motors, alternating current (AC) motor drives are used to provide a requested torque to the motor shaft. In practice, the amount torque produced by the motor is directly related (although not perfectly proportional) to the amount current provided to the motor. Therefore, by regulating and precisely controlling the input current to the electric motor, the amount of torque produced by the electric motor may be more accurately controlled. This is particularly useful, as in practice, the temperature and/or resistance of the electric motor is dynamically changing during operation. For example, by maintaining a constant current through the electric motor, the torque produced by the motor remains relatively constant, even as the resistance of the motor windings increases and/or decreases. Conversely, in the case of a constant voltage across the motor windings, as the resistance of the motor windings increases and/or decreases, the current through the electric motor decreases and/or increases, thereby changing the amount of torque produced by the electric motor at the constant voltage level.

In many systems, the input motor current is not directly controlled. For example, many electric motors are operated using pulse-width modulation (PWM) techniques in combination with an inverter (or another switched-mode power supply) to control the voltage across the motor windings, which in turn, produces the desired current in the motor. In response to a requested torque (or commanded torque), most prior art systems determine a desired input motor current for producing the requested amount of torque and utilize a closed loop control system to control the current through the motor windings and thereby regulate the amount of torque produced the motor (known as vector control or field oriented control). One or more sensors are used to obtain the actual motor current, which is then compared to the desired input motor current. Based on the outcome of the comparison, the PWM commands for the inverter are adjusted to increase and/or decrease the voltage across the motor windings, such that the actual measured motor current tracks the desired input motor current.

When a current sensor used to measure the motor current does not accurately measure the motor current, these closed-loop control systems are degraded and motor control is therefore compromised. For example, without accurate motor current information, the control system may cause the motor to produce insufficient torque, excessive torque, or varying or oscillating amounts of torque. In conventional prior art three-phase electric motor drive systems, each phase of the electric motor has an associated current sensor. Assuming balanced three-phase operation, the sum of the individual phase currents should equal zero at any time. In this regard, when the sum of the phase currents is not equal to zero, the system may identify an error of one of the current sensors and take preventative measures.

In the case of a balanced three-phase electric motor, it is possible to control the electric motor by only measuring the current in two of the three phases, and calculating the third phase current based on the balanced three-phase relationship. It is important to detect errors from one of the current sensors, however, in a system having only two current sensors, an error occurring in one current sensor leaves the system with no redundancy and the prior art methods that utilize three current sensors cannot be used to identify a current sensor error.

BRIEF SUMMARY

A method is provided for controlling an electric motor in a vehicle. The method comprises measuring current associated with a first phase of the electric motor using a first current sensor resulting in a measured first phase current and measuring current associated with a second phase of the electric motor using a second current sensor resulting in a measured second phase current. The method further comprises determining a target value for the measured second phase current based on a value corresponding to a peak current for the first phase and identifying a current sensor error based on a difference between the measured second phase current and the target value.

In accordance with another embodiment, a method is provided for controlling an electric motor using an inverter. The inverter is configured to operate the electric motor in a current-regulated control mode based on measured feedback currents from a first current sensor and a second current sensor. The method comprises identifying a first current value measured by the first current sensor and corresponding to a peak current flowing through a first phase of the electric motor and obtaining a second current value measured by the second current sensor and corresponding to current flowing through a second phase of the electric motor. The method further comprises determining a target current value for the second phase based on the first current value and identifying a current sensor error based on a difference between the target current value and the second current value.

In accordance with another embodiment, an electrical system is provided. The electrical system comprises an energy source, an electric motor having a plurality of phases, and an inverter coupled between the energy source and the electric motor. A first current sensor is coupled to a first phase of the plurality of phases of the electric motor, and the first current sensor is configured to measure current associated with the first phase resulting in a measured first phase current. A second current sensor is coupled to a second phase of the plurality of phases of the electric motor, and the second current sensor is configured to measure current associated with the second phase resulting in a measured second phase current. A controller is coupled to the first current sensor, the second current sensor, and the inverter. The controller is configured to obtain a torque command and operate the inverter in a current-regulated control mode based on the torque command, the measured first phase current, and the measured second phase current. The controller is also configured to identify a steady-state condition, determine a target current value for the second phase in response to identifying the steady-state condition, and identify a current sensor error based the target current value and the measured second phase current. The target current value is based on a value corresponding to a peak current for the first phase.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
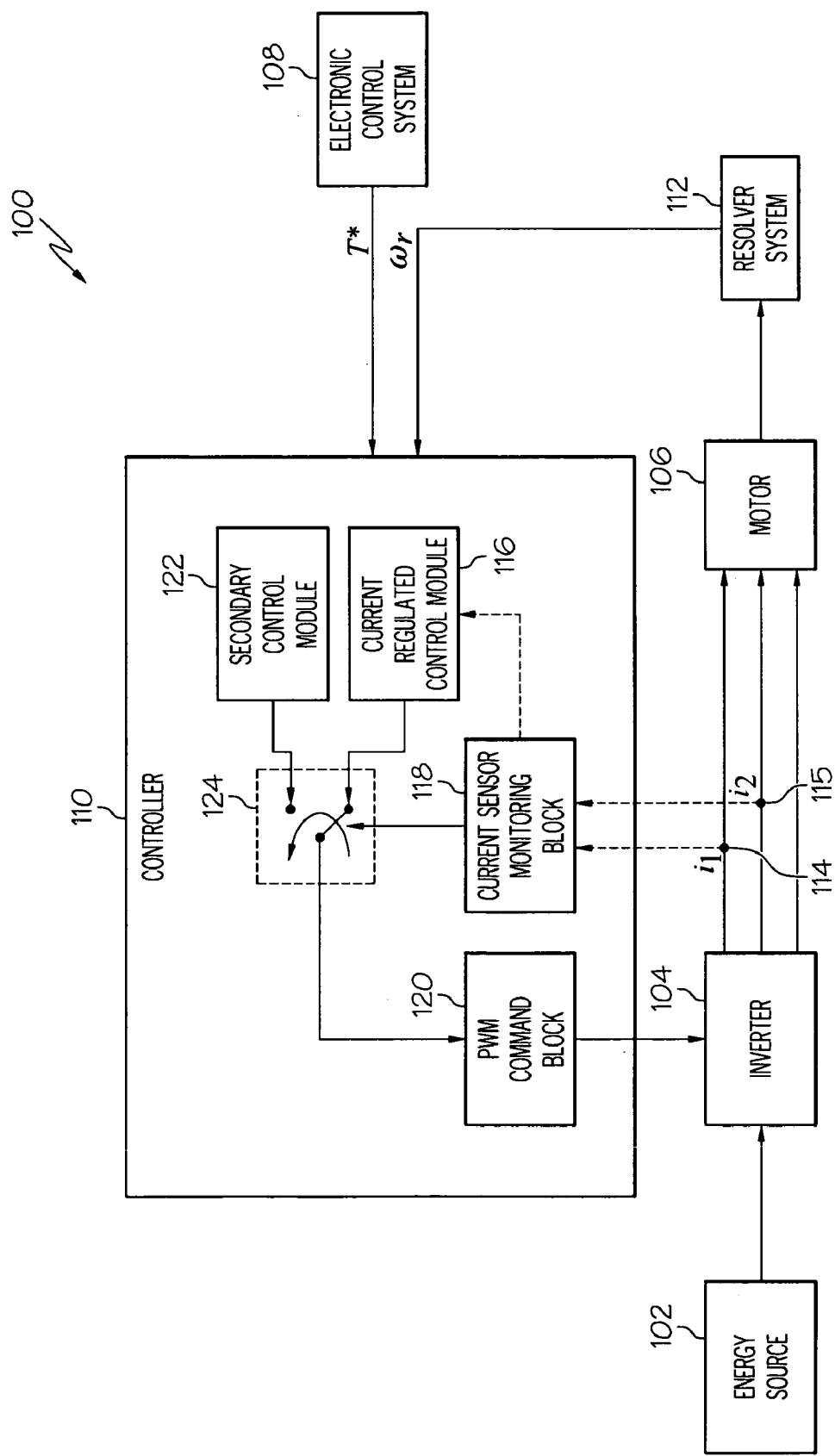
FIG. 1 is a block diagram of an electrical system in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

The following description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the schematics shown in the figures may depict one exemplary arrangement of elements, additional intervening elements, devices, features, or components may be present in an embodiment of the depicted subject matter.

For the sake of brevity, conventional techniques related to current sensing, signaling, vector control and/or field oriented control of electric motors, pulse-width modulation (PWM), switched-mode power supplies (SMPS), and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Technologies and concepts discussed herein relate to detecting a current sensor error in electric motor drive systems that utilize two current sensors. As described in greater detail below, the peak phase current measured by one of the current sensors is obtained and used as a reference for determining whether or not the other current sensor is functioning properly. If a discrepancy between the two current sensors exceeds a threshold value, the system identifies a current sensor error and takes remedial actions. In this manner, if one of the current sensors is exhibiting a gain and/or offset that differs from that of the other current sensor, the system may identify the inability to obtain accurate current information. As used herein, the meaning of subscription and superscription is as follows:

Subscript d and q: Quantity in the d-q frame. The d-q frame of reference, in Cartesian coordinates, is synchronous with the rotation of a rotor within the electric motor.

Superscript *: Quantity which is commanded.

FIG. 1 depicts an exemplary embodiment of an electrical system 100 suitable for use in a vehicle, such as, for example, a hybrid and/or electric automotive vehicle. In an exemplary embodiment, the electrical system 100 includes, without limitation, an energy source 102, an inverter 104, an electric motor 106, an electronic control system 108, a controller 110, a resolver system 112, a first current sensor 114, and a second current sensor 115. It should be understood that FIG. 1 is a simplified representation of an electrical system 100 for purposes of explanation and is not intended to limit the scope of the subject matter in any way. In this regard, in an exemplary embodiment, the electrical system 100 comprises two current sensors 114, 115.

In an exemplary embodiment, the energy source 102 is coupled to the inverter 104, which in turn is coupled to the electric motor 106. In an exemplary embodiment, the current sensors 114, 115 are coupled between the inverter 104 and the electric motor 106. Each current sensor 114, 115 is associated with or coupled to a particular phase of the electric motor 106, wherein each of the current sensors 114, 115 is configured to measure the current flowing through the phase of the electric motor 106 that is associated with the respective current sensor 114, 115. The controller 110 is coupled to the current sensors 114, 115 and configured to obtain the measured motor phase currents from the current sensors 114, 115. The resolver system 112 is coupled between the electric motor 106 and the controller 110, and the resolver system 112 is suitably configured to measure or otherwise obtain the motor speed ($\omega_r$), that is, the rotational speed of the rotor within the electric motor 106, and provide the result to controller 110. The electronic control system 108 is coupled to the controller 110, and the electronic control system 108 is suitably configured to provide a torque command (T*) to the controller 110. As described in greater detail below, in an exemplary embodiment, the controller 110 is suitably configured to utilize pulse-width modulation (PWM) techniques to regulate the current and/or voltage provided to the electric motor 106 via the inverter 104 such that the torque produced by the electric motor 106 tracks the torque command (T*) provided by the electronic control system 108.

The energy source 102 provides electrical energy and/or voltage to the inverter 104 for driving the electric motor 106. Depending on the embodiment, the energy source 102 may be realized as a battery, a fuel cell, a rechargeable high-voltage battery pack, an ultracapacitor, or another suitable energy source known in the art. Depending on the embodiment, the electric motor 106 may be realized as an induction motor, an internal permanent magnet (IPM) motor, a synchronous reluctance motor, or another suitable motor known in the art. In an exemplary embodiment, the electric motor 106 is a three-phase alternating current (AC) electric machine having a rotor and stator windings.

In an exemplary embodiment, the inverter 104 is realized as a power inverter configured to convert the DC power from the energy source 102 into AC power for driving the electric motor 106. The inverter 104 preferably includes a plurality phase legs, each phase leg being coupled to a corresponding phase of the electric motor 106, wherein switches of the phase legs are modulated (opened or closed) with a particular duty cycle to produce an effective AC voltage across the stator windings of the electric motor 106. The AC voltage across the stator windings of the electric motor 106 creates torque-producing current in the stator windings and operates the electric motor 106, as will be appreciated in the art.

Depending on the embodiment, the electronic control system 108 may include various sensors and automotive control modules, electronic control units (ECUs), and the like, and the electronic control system 108 may be coupled to additional vehicle components, as will be appreciated in the art. In an exemplary embodiment, the electronic control system 108 generates a torque command (T*) in response to a request for torque (e.g., a driver depressing an accelerator pedal or throttle), and provides the torque command to the controller 110.

The controller 110 generally represents the hardware, software, and/or firmware components configured to control or otherwise regulate the torque produced by the electric motor 106 and perform additional tasks and/or functions described in greater detail below. In this regard, the controller 110 varies the duty cycle and/or switching frequency of the PWM command signals used to modulate the switches of the inverter phase legs, such that the torque produced by the electric motor 106 tracks the torque command (T*).

In an exemplary embodiment, the resolver system 112 comprises a resolver coupled to the electric motor 106, and the output of the resolver is coupled to a resolver-to-digital converter. The resolver (or similar speed sensing device) senses the position of the rotor and, thereby, derives the speed ($\omega_r$) of the electric motor 106 (alternatively referred to herein as the motor speed or rotor speed). The resolver-to-digital converter converts the analog signals from the resolver to digital signals (e.g., a digital motor speed signal) which are provided to the controller 110.

In an exemplary embodiment, the controller 110 includes, without limitation, a current regulated control module 116, a current sensor monitoring block 118, a PWM command block 120, a secondary control module 122, and a selection arrangement 124. The current sensor monitoring block 118 is coupled to the current sensors 114, 115 and the current regulated control module 116. The current regulated control module 116 is configured to produce commands for generating PWM signals for the phase legs of the inverter 104 based on the measured motor current obtained by the current sensors 114, 115. As described in greater detail below, the secondary control module 122 is also configured to produce commands for generating PWM signals for the phase legs of the inverter 104 in order to operate the electric motor 106 in response to a current sensor error. The output of the current regulated control module 116 and the output of the secondary control module 122 are each coupled to the selection arrangement 124. In an exemplary embodiment, the current sensor monitoring block 118 is coupled to the selection arrangement 124 and configured to utilize the selection arrangement 124 to select which commands are provided to the PWM command block 120, as described in greater detail below. The PWM command block 120 generates PWM command signals and operates the phase legs of the inverter 104 based on the commands provided to the PWM command block 120 from either the current regulated control module 116 or the secondary control module 122 via the selection arrangement 124.

Figure 2:
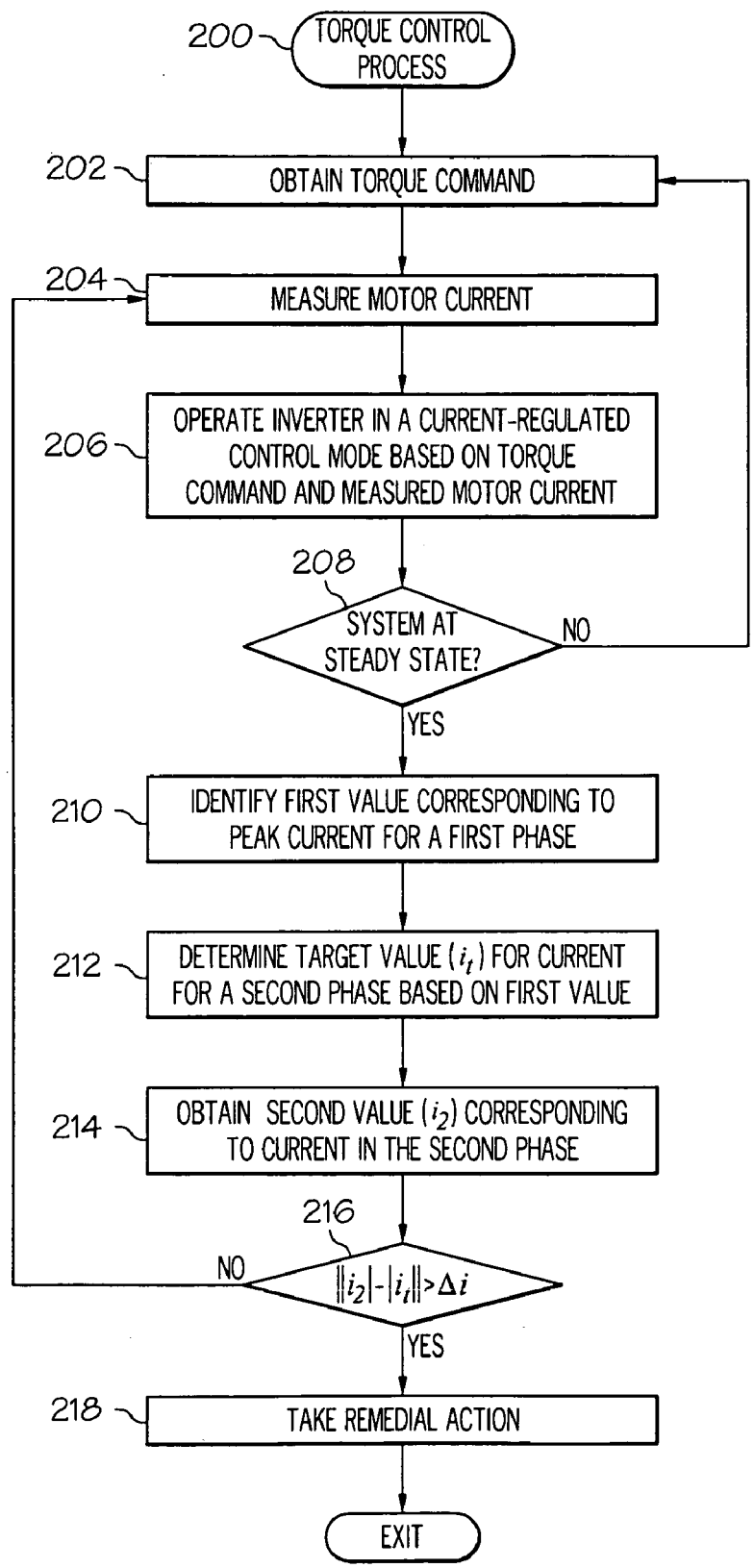
FIG. 2 is a flow diagram of a motor control process suitable for use with the electrical system of FIG. 1 in accordance with one embodiment.

Referring now to FIG. 2, in an exemplary embodiment, an electrical system may be configured to perform a motor control process 200 and additional tasks, functions, and operations described below. The various tasks may be performed by software, hardware, firmware, or any combination thereof. For illustrative purposes, the following description may refer to elements mentioned above in connection with FIG. 1. In practice, the tasks, functions, and operations may be performed by different elements of the described system, such as the controller 110, the current regulated control module 116, the current sensor monitoring block 118, the secondary control module 122, the selection arrangement 124, and/or the PWM command block 120. It should be appreciated that any number of additional or alternative tasks may be included, and may be incorporated into a more comprehensive procedure or process having additional functionality not described in detail herein.

Referring to FIG. 2, and with continued reference to FIG. 1, a motor control process 200 may be performed to control and/or regulate the torque produced by an electric motor. In an exemplary embodiment, the motor control process 200 initializes or begins by obtaining a torque command for an electric motor, measuring the motor current, and operating the electric motor in a current-regulated control mode based on the measured motor current (tasks 202, 204, 206). In an exemplary embodiment, the controller 110 obtains the torque command (T*) from the electronic control system 108 and then regulates the current in the electric motor 106 such that the torque produced by the electric motor 106 tracks the torque command. In the current-regulated control mode, the controller 110 obtains a current command for the electric motor 106 based on the torque command (T*) and then generates PWM command signals for the phase legs of the inverter 104 based on a difference between the current command and the measured motor current in order to produce the commanded torque with minimal input current to the electric motor 106. In this regard, the selection arrangement 124 may be initially configured such that the output of the current regulated control module 116 is provided to the input of the PWM command block 120, that is, the current regulated control module 116 is initially coupled to the PWM command block 120 via the selection arrangement 124.

In an exemplary embodiment, the current regulated control module 116 determines and/or obtains synchronous frame current commands ($i^*_d$ and $i^*_q$) (e.g., from a table and/or database) based at least in part on the torque command (T*)

and the instantaneous speed ($\omega_r$) of the electric motor 106. In accordance with one or more embodiments, the synchronous frame current commands correspond to the minimal input current to the electric motor 106 for producing the commanded torque. In this regard, the electric motor 106 may be analyzed and/or characterized for purposes of determining commands for controlling operation of the inverter such that the electric motor achieves the commanded amount of torque with minimal input current for the particular motor speed. For example, the electric motor may be characterized on a test bench, in a lab, and/or using software and/or computer simulations before the electrical system 100 and/or electric motor 106 are implemented in a vehicle. The torque capability versus motor speed for the electric motor 106 may be determined, resulting in a range of achievable (or possible) torque values and corresponding range of achievable (or possible) motor speeds. For each particular combination of torque value and motor speed value, the minimum synchronous frame current needed to produce the particular torque may be determined and/or calculated. The resulting minimum synchronous frame current may then be stored and/or maintained in a table or database (e.g., within the current regulated control module 116) that maintains the association between the synchronous frame current and the corresponding torque and motor speed combination.

Each current sensor 114, 115 measures and/or senses the current in the respective phase of the electric motor 106 associated with and/or coupled to the respective current sensor 114, 115. For example, the first current sensor 114 is coupled to or otherwise associated with a first phase (e.g., the 'a' phase) of the electric motor 106 and measures and/or senses the current in the first phase of the electric motor 106 resulting in a measured first phase current (e.g., $i_1$). Similarly, the second current sensor 115 is coupled to or otherwise associated with a second phase (e.g., the 'b' phase) of the electric motor 106 and measures and/or senses the current in the second phase of the electric motor 106 resulting in a measured second phase current (e.g., $i_2$). In practice, the current sensors 114, 115 measure or otherwise obtain the current through the respective phases by sampling the current through the associated phase at a particular sampling rate. In an exemplary embodiment, when the current sensors 114, 115 are both functioning properly, they exhibit the same gain with no offset. The current sensor monitoring block 118 obtains the measured phase currents and calculates and/or determines a resultant measured motor current vector based on the measured phase currents. In an exemplary embodiment, the current sensor monitoring block 118 determines and/or calculates the measured motor current in the synchronous reference frame ($i_d$ and $i_q$) based on the measured phase currents assuming balanced three-phase operation of the electric motor 106 and provides the synchronous frame measured motor current to the current regulated control module 116.

In an exemplary embodiment, the current regulated control module 116 obtains the synchronous frame measured motor current and utilizes a synchronous frame current regulator to compare the measured motor current ($i_d$ and $i_q$) to the synchronous frame current commands ($i_d^*$ and $i_q^*$). Based on the comparison, the current regulator generates a synchronous voltage ($v_d$ and $v_q$) for producing the commanded current (and thereby the commanded torque) in the electric motor 106. The current regulated control module 116 converts the synchronous voltage into stationary voltage commands ($v_a^*$, $v_b^*$, and $v_c^*$) for producing the commanded current and provides the stationary voltage commands to the PWM command block 120. The PWM command block 120 determines PWM command signals for the phase legs of the inverter 104 based on the stationary voltage commands ($v_a^*$, $v_b^*$, and $v_c^*$) such that the effective AC voltages across the corresponding phases of the stator windings are substantially equal (within practical and/or realistic operating tolerances) to the stationary voltage commands, as will be appreciated in the art. In this manner, based on the measured motor current, the current regulated control module 116 increases and/or decreases the voltage commands ($v_a^*$, $v_b^*$, and $v_c^*$) provided to the PWM command block 120, causing the PWM command block 120 to produce a corresponding increase and/or decrease in the voltage across the stator windings of the electric motor 106. As a result, the measured motor current tracks the current command, that is, $i_d$ is substantially equal to $i_d^*$ and $i_q$ is substantially equal to $i_q^*$, and as a result, the torque produced by the electric motor 106 tracks the torque command.

In an exemplary embodiment, the motor control process 200 continues by determining whether the electrical system is operating in a steady-state condition (task 208). As used herein, a steady-state condition should be understood as referring to a condition where the requested and/or commanded torque has not changed over a preceding interval such that the currents in the electric motor are substantially sinusoidal. In this regard, the closed-loop torque control system implemented by the controller 110 and/or current regulated control module 116 may have a particular bandwidth and/or loop time, wherein the torque commands are obtained at regular intervals based on the bandwidth and/or loop time. For example, the current-regulated control loop implemented by current regulated control module 116 may have a bandwidth of approximately 500 Hz (or a loop time of approximately 2 ms), wherein the controller 110 and/or current regulated control module 116 obtains a new torque command approximately every 2 ms. In an exemplary embodiment, a steady-state condition exists when the torque command has not changed during at least the immediately preceding loop time. Depending on the speed of the electric motor, the steady-state condition may exist when the torque command has not changed for more than one preceding loop time. For example, at higher motor speeds, the steady-state condition may exist if the torque command has not changed during the immediately preceding loop time, however, at lower motor speeds, the steady-state condition may only exist if the torque command has not changed during a multiple number of preceding loop intervals.

In an exemplary embodiment, the controller 110 is configured to compare the torque command (T*) to one or more preceding torque commands and determine whether the torque command is equal to the one or more preceding torque commands. In this regard, the controller 110 compares the torque command (T*) to the one or more immediately preceding torque commands to determine whether the commanded and/or requested torque has changed. Alternatively, because the torque commands and current commands are mapped directly within the controller 110 and/or current regulated control module 116, the current commands may be compared to the current commands from the one or more preceding control loop intervals. By ensuring that a steady-state condition exists, the amplitude of the motor current vector should not change its amplitude, thereby allowing the peak of the first phase current to be reliably identified and/or determined, as described in greater detail below. If the motor control process 200 determines that a steady-state condition does not exist, the motor control process 200 repeats by continuing to obtain torque commands, measuring the motor current, and operating the inverter and/or motor in the current regulated-control mode (e.g., tasks 202, 204 and 206).

In an exemplary embodiment, in response to determining and/or identifying a steady-state condition, the motor control process 200 continues by identifying a value that corresponds to the peak current (e.g., the amplitude of the sinusoidal current) through a first phase of the electric motor (task 210). In an exemplary embodiment, the controller 110 and/or current sensor monitoring block 118 performs a peak detection algorithm on the measured first phase current to identify or determine the maximum value for the measured first phase current. For example, in the steady-state condition, as the motor current vector rotates, the first phase current will increase until reaching a maximum value (i.e., when the motor current vector is aligned along the positive axis for the first phase) and then begin decreasing. As the first phase current is measured and/or sampled, the controller 110 and/or current sensor monitoring block 118 may compare the most recently sampled value to the prior sample, and identify the maximum value when the measured first phase current begins decreasing after previously increasing. In this regard, the maximum value for the measured first phase current corresponds to the peak current (or maximum current) flowing through the first phase of the electric motor 106. In practice, depending on the sampling rate for the current sensor and/or the timing of the particular samples, the identified maximum value for the measured first phase current may not be perfectly equal to the actual peak current for the first phase due to the fact that the maximum value is determined based on a sampled signal. As described in greater detail below, the motor control process 200 may be implemented in a manner that samples the current and/or determines measured phase current values multiple times which allows noise and/or quantization errors to be filtered in a conventional manner, as will be appreciated in the art. It should be noted that although the subject matter is described in the context of determining the maximum value for the measured first phase current (e.g., detecting the positive peak), the subject matter may be modified and/or implemented in a similar manner by determining the minimum value for the measured first phase current (e.g., detecting the negative peak), and the subject matter is not limited to any particular manner for detecting the peak current, as will be appreciated in the art.

In an exemplary embodiment, the motor control process 200 continues by determining a target current value for the second phase current based on the previously identified value that corresponds to the peak current through the first phase (task 212). In this regard, the target current value corresponds to a value for the measured current in the second phase that indicates that the current sensors 114, 115 are functioning properly, that is, both of the current sensors 114, 115 have substantially the same gain and/or offset. Depending on the embodiment, the target current value may be equal to either the identified maximum value of the measured first phase current or one half of the identified maximum value of the measured first phase current, as described in greater detail below. In an exemplary embodiment, the motor control process 200 obtains a value corresponding to the current in the second phase, and compares the value for the second phase current to the target current value to determine and/or identify whether the current sensors are functioning properly (tasks 214, 216). If the motor control process 200 determines and/or identifies the current sensors are functioning properly, the loop defined by tasks 202, 204, 206, 208, 210, 212, 214, and 216 repeats as desired. However, if the motor control process 200 determines and/or identifies a current sensor error (e.g., either and/or both current sensors are not functioning properly), the motor control process 200 continues by taking one or more remedial measures and/or actions (task 218), as described in greater detail below. As used herein, a current sensor error should be understood as referring to a situation wherein at least one of the current sensors is not functioning properly, that is, an erroneous current sensor is exhibiting gain and/or offset that is sufficiently different from the other current sensor or the erroneous current sensor is otherwise unable to accurately measure and/or obtain the current through its associated phase of the electric motor.

In accordance with one embodiment, the target current value for the second phase current is equal to one half of the identified value that corresponds to the peak current through the first phase of the electric motor 106. For balanced three-phase operation at steady-state, it is known that a phase current peak occurs when the resultant motor current vector coincides with (or is aligned and/or projected along) the corresponding phase axis, and as a result, the angle of the current vector is known when one of the measured phase currents attains its peak value. For an example, at the instant when the motor current vector aligns with the positive phase 'a' axis, the angle of the motor current vector and the negative phase 'b' axis will be sixty electrical degrees. This means that the magnitude or absolute value of the phase 'b' current will be equal to one half of the peak value of the phase 'a' current at the time of the phase 'a' peak current if the current sensors associated with the two phases have the same gain and/or offset.

Figure 3:
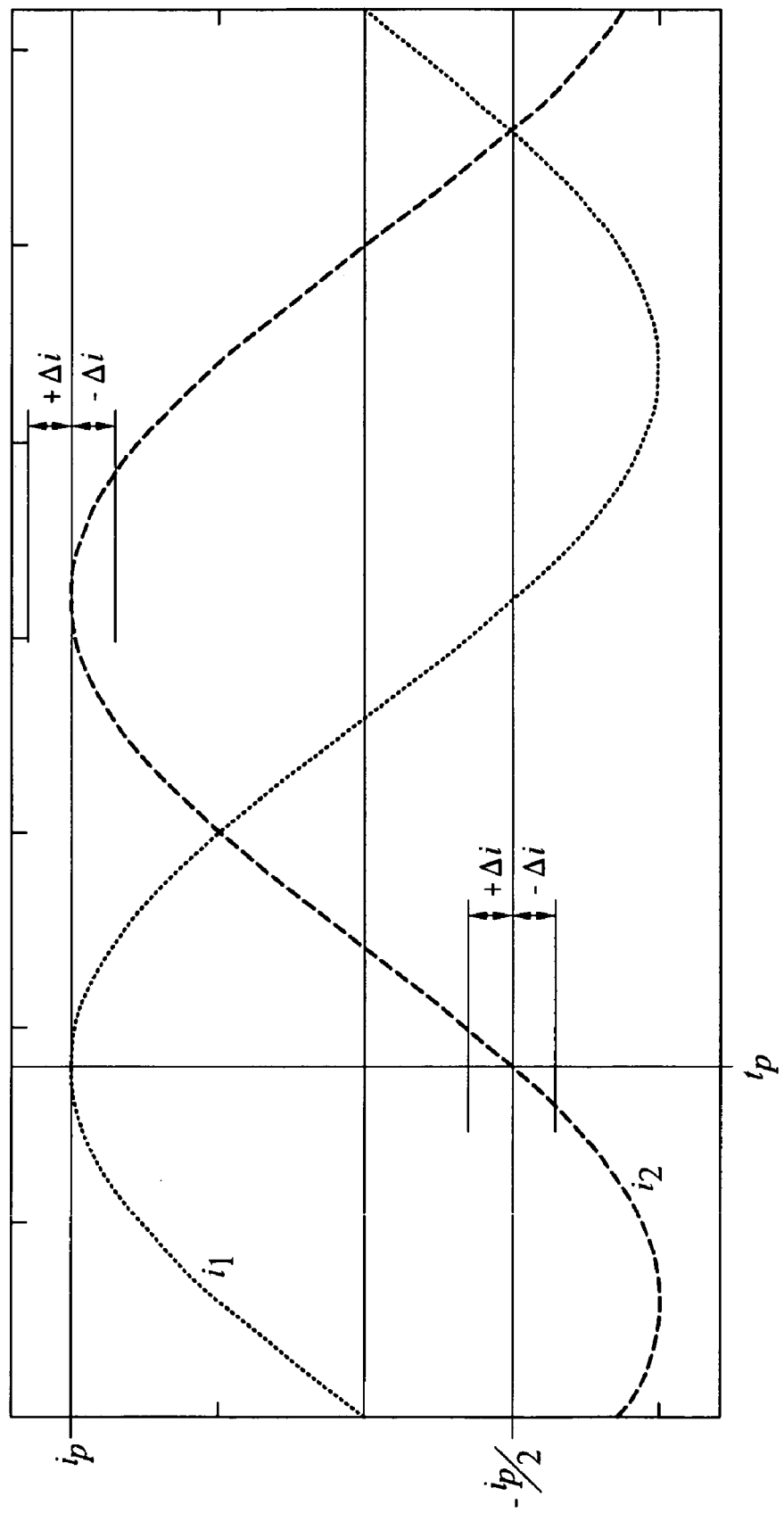
FIG. 3 is a graph of measured phase currents versus time depicting operation of two current sensors suitable for use with the motor control process of FIG. 2 in accordance with one embodiment.

For example, referring now to FIG. 3, and with continued reference to FIG. 1 and FIG. 2, the motor control process 200 may identify the maximum value ($i_p$) of the measured first phase current ($i_1$) at a particular time ($t_p$) and determine the target current value for the second phase current as being equal to one half of the maximum value for the measured first phase current (tasks 210, 212). The motor control process 200 may then obtain and/or identify a value corresponding to the current flowing through the second phase of the electric motor at the time of the peak of the first phase current by obtaining and/or identifying the value of the measured second phase current ($i_2$) that corresponds to the current flowing through the second phase of the electric motor at the time ($t_p$) at which the maximum of the measured first phase current occurred (task 214). In an exemplary embodiment, the value of the measured second phase current ($i_2$) that corresponds to the time ($t_p$) at which the maximum of the measured first phase current occurred is the value of the measured second phase current at the time ($t_p$). However, in other embodiments, the measured second phase current ($i_2$) that corresponds to the time ($t_p$) at which the maximum of the measured first phase current occurred may not be the value of the measured second phase current at the time ($t_p$), but rather a value of the measured second phase current within some threshold time period of the time at which the maximum of the measured first phase current occurred (e.g., $t_p \pm \Delta t$) As described in greater detail below, the motor control process 200 continues by identifying a current sensor error based on a difference between the obtained value for the measured second phase current corresponding to time ($t_p$) and the target current value.

In an exemplary embodiment, because the measured phase currents both represent sampled current waveforms (i.e., discrete waveforms rather than continuous waveforms), the difference between the magnitude of the measured second phase current and the target current value is compared to a threshold value ($\Delta i$) that accounts for the fact that the sampling may not occur precisely when the first phase current is at its peak value. In an exemplary embodiment, the threshold value is chosen to be approximately ten percent of the identified maximum value for the measured first phase current, however, in practice, the threshold value vary depending on the needs of a particular application. The motor control process 200 detects and/or identifies a current sensor error when the magnitude of the difference between the magnitude of the measured second current value at time ($t_p$) and the magnitude of the target current value is greater the threshold value (task 216). In this regard, a current sensor error could be identified when one of the current sensors is either exhibiting an offset with a magnitude greater than the threshold value ($\Delta i$), exhibiting a gain that causes the maximum value for one measured phase current to exceed the other by an amount greater than twice the threshold value, or one of the current sensor is otherwise unable to accurately measure and/or obtain the current through its associated phase of the electric motor.

In accordance with another embodiment, the target current value for the second phase current is equal to the value that corresponds to the peak current through the first phase of the electric motor 106. Assuming balanced three-phase operation at steady-state, the peak current for each phase should be equal to that of the other phases. For example, referring again to FIG. 3, and with continued reference to FIG. 1 and FIG. 2, the motor control process 200 may identify the maximum value ($i_p$) of the measured first phase current ($i_1$) and determine the target current value for the second phase current as being equal to the maximum value for the measured first phase current (tasks 210, 212). The motor control process 200 may then obtain and/or identify a value corresponding to the peak current flowing through the second phase of the electric motor. In this regard, the motor control process 200 may obtain and/or identify the maximum value of the measured second phase current in a similar manner as described above (e.g., task 210). The motor control process 200 may then detect and/or identify a current sensor error when the magnitude of the difference between the magnitude of the maximum value for the measured second phase current and the magnitude of the target current value is greater the threshold value (task 216). In other words, for this embodiment, the motor control process 200 identifies a current sensor error when a difference between the maximum value of the first phase current and the maximum value of the second phase current exceeds the threshold value.

Referring again to FIG. 2, with continued reference to FIG. 1 and FIG. 3, in response to detecting and/or identifying a current sensor error, the motor control process 200 continues by taking remedial actions and/or other measures to ensure safe and/or effective operation of the electric motor (task 218). For example, in accordance with one embodiment, the motor control process 200 may disable the current-regulated control mode in response to a current sensor error. If the current sensor monitoring block 118 detects and/or identifies a current sensor error, the current sensor monitoring block 118 activate or otherwise change the status of the selection arrangement 124 such that the output of the current regulated control module 116 is decoupled from the PWM command block 120. In this regard, activating the selection arrangement 124 may couple the output of secondary control module 122 to the input of the PWM command block 120 via the selection arrangement 124. In this regard, the secondary control module 122 and/or controller 110 may be configured to operate the inverter 104 in a second operating mode (or secondary control mode) in response to a current sensor error. For example, in accordance with one embodiment, the secondary control module 122 may be configured to stop the electric motor 106 by providing the appropriate stationary voltage commands to the PWM command block 120 to safely bring the electric motor 106 to a stop. In other embodiments, the secondary control module 122 may control the voltage and/or current provided to the electric motor 106 in a manner that causes the torque produced by the electric motor 106 to roughly track the torque command. In some embodiments, the secondary control module 122 may limit the voltage and/or current provided to the electric motor 106. In addition, the motor control process 200 may be configured to take additional remedial measures, such as, for example, providing notification of a current sensor error to the electronic control system 108 or another component of the electrical system 100 which causes an audible and/or visual warning to be generated in the vehicle (e.g., turning on the check engine light). It should be appreciated that any number of remedial actions and various combinations thereof may be utilized in any practical embodiment.

In an exemplary embodiment, the loop defined by tasks 202, 204 206, 208, 210, 212, 214, and 216 may repeat as desired during operation of the electric motor. In addition, the loop defined by tasks 204, 206, 208, 210, 212, 214, and 216 may repeat multiple times during a steady-state condition (e.g., a torque control loop interval), in order to allow a current sensor error to be detected and/or identified more quickly or to add redundancy to the motor control process 200. For example, the frequency of the measured phase currents may be in the kilohertz range while the torque control loop operates at around five hundred hertz, thereby allowing the peak of a phase current to be identified and/or detected multiple times within the torque control loop interval. In this regard, if for example the measured phase currents are oscillating at a frequency four times that of the torque control loop bandwidth, if the obtained measured second phase current value (task 214) is within the threshold value of the target current value (task 216) three out of four times during the torque control loop/steady-state condition, the motor control process 200 may identify the discrepancy as a false identification of a current sensor error (e.g., due to noise or some other factor) and continue operating in the current-regulated control more (task 206) rather than taking remedial measures (task 218). In other embodiments, the measured first phase current peak value (e.g., task 210) and/or the obtained measured second phase current value (e.g., task 214) may be averaged and/or filtered to reduce quantization noise and/or other noise, as will be appreciated in the art.

One advantage of the methods and/or systems described above is that a current sensor error may be identified in an electric motor drive system having only two current sensors. In response to a current sensor error, the electric motor may be controlled in a manner that does not rely on feedback information pertaining to the motor current. This allows only two current sensors to be used in the electrical system, thereby achieving cost and/or component savings.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:
1. A method for controlling an electric motor in a vehicle, the method comprising:

measuring current associated with a first phase of the electric motor using a first current sensor resulting in a measured first phase current;

measuring current associated with a second phase of the electric motor using a second current sensor resulting in a measured second phase current;

determining a target value for the measured second phase current based on a value corresponding to a peak current for the first phase; and identifying a current sensor error based on a difference between the measured second phase current and the target value.

2. The method of claim 1, wherein determining the target value for the measured second phase current comprises:

identifying a maximum value of the measured first phase current; and determining the target value based on the maximum value.

3. The method of claim 2, the target value being equal to one half of the maximum value, and the maximum value being associated with a first time, wherein identifying the current sensor error comprises:

obtaining a second value based on the measured second phase current, the second value corresponding to current through the second phase at the first time; and detecting the current sensor error when a magnitude of a difference between a magnitude of the second value and a magnitude of the target value is greater than a threshold value.

4. The method of claim 2, the target value being equal to the maximum value, wherein identifying the current sensor error comprises:

identifying a second value for the measured second phase current, the second value corresponding to a peak value for the measured second phase current; and detecting the current sensor error when a magnitude of a difference between a magnitude of the second value and a magnitude of the target value is greater than a threshold value.

5. The method of claim 1, the electric motor being coupled to an inverter configured to drive the electric motor, the method further comprising:

operating the inverter in a current-regulated control mode based on the measured first phase current and the measured second phase current; and operating the inverter in a second operating mode in response to identifying the current sensor error.

6. The method of claim 5, wherein operating the inverter in the second operating mode comprises stopping the electric motor.

7. The method of claim 1, the electric motor being coupled to an inverter configured to drive the electric motor, the method further comprising:

obtaining a torque command; and operating the inverter in a current-regulated control mode based on the torque command, the measured first phase current, and the measured second phase current.

8. The method of claim 7, wherein operating the inverter in the current-regulated control mode comprises:

determining a current command based at least in part on the torque command;

determining a measured motor current based on the measured first phase current and the measured second phase current; and generating pulse-width modulation command signals for the inverter based on a difference between the current command and the measured motor current.

9. The method of claim 7, further comprising comparing the torque command to a previous torque command, wherein determining the target value for the measured second phase current comprises determining the target value for the measured second phase current in response to determining that the torque command is equal to the previous torque command.

10. A method for controlling an electric motor using an inverter, the inverter being configured to operate the electric motor in a current-regulated control mode based on measured feedback currents from a first current sensor and a second current sensor, the method comprising:

identifying a first current value, the first current value being measured by the first current sensor and corresponding to a peak current flowing through a first phase of the electric motor;

obtaining a second current value, the second current value being measured by the second current sensor and corresponding to current flowing through a second phase of the electric motor;

determining a target current value for the second phase based on the first current value; and identifying a current sensor error based on a difference between the target current value and the second current value.

11. The method of claim 10, further comprising taking remedial action in response to identifying the current sensor error.

12. The method of claim 11, wherein taking remedial action comprises:

disabling the current-regulated control mode; and operating the inverter in a second operating mode.

13. The method of claim 10, the target current value being equal to one half of the first current value, and the first current value being associated with a first time, wherein:

obtaining the second current value comprises obtaining a value corresponding to current flowing through the second phase of the electric motor at the first time; and identifying the current sensor error comprises identifying the current sensor error when a magnitude of a difference between a magnitude of the second current value and a magnitude of the target current value is greater than a threshold value.

14. The method of claim 10, the target current value being equal to the first current value, wherein:

obtaining the second current value comprises obtaining a value corresponding to a peak current flowing through the second phase of the electric motor; and identifying the current sensor error comprises identifying the current sensor error when a magnitude of a difference between a magnitude of the second current value and a magnitude of the target current value is greater than a threshold value.

15. The method of claim 10, further comprising:

obtaining a torque command; and comparing the torque command to a preceding torque command, wherein the target current value for the second phase is determined in response to determining that the torque command is equal to the preceding torque command.

16. An electrical system for use in a vehicle, the electrical system comprising:

an energy source;

an electric motor having a plurality of phases;

an inverter coupled between the energy source and the electric motor;

a first current sensor coupled to a first phase of the plurality of phases of the electric motor, the first current sensor being configured to measure current associated with the first phase resulting in a measured first phase current;

a second current sensor coupled to a second phase of the plurality of phases of the electric motor, the second current sensor being configured to measure current associated with the second phase resulting in a measured second phase current;

a controller coupled to the first current sensor, the second current sensor, and the inverter, wherein the controller is configured to:
obtain a torque command;
operate the inverter in a current-regulated control mode based on the torque command, the measured first phase current, and the measured second phase current;
identify a steady-state condition;
determine a target current value for the second phase in response to identifying the steady-state condition, the target current value being based on a value corresponding to a peak current for the first phase; and
identify a current sensor error based the target current value and the measured second phase current.

17. The electrical system of claim 16, wherein the controller is configured to identify a maximum value of the measured first phase current, wherein the target current value is determined based on the maximum value.

18. The electrical system of claim 17, the target current value being equal to one half of the maximum value, and the maximum value being associated with a first time, wherein the controller is configured to identify the current sensor error by:
obtaining a second value corresponding to current through the second phase at the first time; and
detecting the current sensor error when a magnitude of a difference between a magnitude of the second value and a magnitude of the target current value is greater than a threshold value.

19. The electrical system of claim 17, the target current value being equal to the maximum value of the measured first phase current, wherein the controller is configured to identify the current sensor error by:
identifying a maximum value of the measured second phase current; and
detecting the current sensor error when a magnitude of a difference between a magnitude of the maximum value of the measured second phase current and a magnitude of the target current value is greater than a threshold value.

20. The electrical system of claim 16, wherein in response to identifying the current sensor error, the controller is configured to:
disable the current-regulated control mode; and
operate the inverter in a second operating mode.

* * * * *